United States Patent
Vondle et al.

(10) Patent No.: US 9,158,285 B2
(45) Date of Patent: Oct. 13, 2015

(54) FLEXIBLE WRISTWATCH WITH SEGMENTED E-PAPER DISPLAY

(71) Applicant: Central Standard Timing, LLC, Chicago, IL (US)

(72) Inventors: David Wisely Vondle, Chicago, IL (US); Jeremiah Peter O'Leary, Chicago, IL (US)

(73) Assignee: CENTRAL STANDARD TIMING, LLC, Chicago, IL (US)

(*) Notice: Subject to any disclaimer, the term of this patent is extended or adjusted under 35 U.S.C. 154(b) by 0 days.

(21) Appl. No.: 14/590,695

(22) Filed: Jan. 6, 2015

(65) Prior Publication Data

US 2015/0192903 A1    Jul. 9, 2015

Related U.S. Application Data

(60) Provisional application No. 61/923,839, filed on Jan. 6, 2014.

(51) Int. Cl.
  *G04B 17/04* (2006.01)
  *G04G 17/08* (2006.01)
  *H05K 3/30* (2006.01)
  *G04G 17/04* (2006.01)
  *A44C 5/00* (2006.01)

(52) U.S. Cl.
  CPC ............... *G04G 17/08* (2013.01); *H05K 3/305* (2013.01); *A44C 5/0015* (2013.01); *G04G 17/04* (2013.01)

(58) Field of Classification Search
  CPC ....... G04G 17/08; G04G 17/04; G04C 3/001; A44C 5/0015
  USPC .......................................................... 368/282
  See application file for complete search history.

(56) References Cited

U.S. PATENT DOCUMENTS

| | | | | |
|---|---|---|---|---|
| 4,130,987 | A * | 12/1978 | Schickedanz | 368/29 |
| 6,216,490 | B1 * | 4/2001 | Radley-Smith | 63/3 |
| 7,518,959 | B2 * | 4/2009 | Akaiwa et al. | 368/82 |
| 7,722,245 | B2 * | 5/2010 | Baba et al. | 368/281 |
| 7,969,314 | B2 * | 6/2011 | Boyd et al. | 340/573.1 |
| 8,517,896 | B2 * | 8/2013 | Robinette et al. | 482/8 |
| 2001/0043513 | A1 * | 11/2001 | Grupp | 368/281 |
| 2003/0016590 | A1 * | 1/2003 | Brewer et al. | 368/82 |
| 2003/0026171 | A1 * | 2/2003 | Brewer et al. | 368/82 |
| 2007/0176309 | A1 * | 8/2007 | Kanbayashi | 264/1.1 |
| 2008/0002527 | A1 * | 1/2008 | Ishii et al. | 368/239 |
| 2010/0061195 | A1 * | 3/2010 | Kanbayashi | 368/239 |
| 2015/0105221 | A1 * | 4/2015 | Roush et al. | 482/8 |

OTHER PUBLICATIONS enclose—dictionary.com—May 29, 2015.*
encapsulate—dictionary.com—May 29, 2015.*

* cited by examiner

*Primary Examiner* — Sean Kayes
(74) *Attorney, Agent, or Firm* — Gottlieb, Rackman & Reisman, PC

(57) ABSTRACT

A thin and flexible wrist watch that includes a segmented e-paper display screen for displaying time. The watch is programmable and rechargeable by interaction with a base station.

12 Claims, 14 Drawing Sheets

FLEXIBLE WRISTWATCH WITH SEGMENTED E-PAPER DISPLAY

CROSS-REFERENCE TO RELATED APPLICATION

This patent application claims benefit under 35 U.S.C. §119 to U.S. Provisional Patent Application No. 61/923,839, filed Jan. 6, 2014, which is hereby incorporated by reference in its entirety.

FIELD OF THE INVENTION

The present invention generally relates to chronographs and watches and more particularly to a flexible and thin wrist watch with segmented e-paper technology for displaying time.

BACKGROUND OF THE INVENTION

Devices for measuring time have become an integral part of human life. Devices used to measure time have evolved from sundials to mechanical and digital wrist watches, pendulum wall clocks, and other devices. When the wrist watch was first introduced, it was analog in design that included many gear and springs arrangements with the springs requiring periodic manual rotation by a knob for the watch to operate for a period of time. However, due to regular use, the process of rotating the knob commonly led to a reduction in the accuracy of the timekeeping function of the watch. Also, the analog watches were prone to shocks an individual when carried.

Subsequent to analog mechanical watches, digital timepieces were developed. These watches utilized internal circuitry to display time via a Liquid Crystal Display. Although, digital watches were successful in providing an accurate time, they required a battery cell that must be regularly replaced after a period of use to provide energy for operation of the internal circuits and the displaying of time. Also, the digital display face can become difficult to view under bright light (e.g., sunlight). Moreover, digital watches are typically bulky due to the depth of their face as a result, in large part, to the required circuitry, Liquid Crystal Display, battery cell, and operational buttons.

Known mechanical and digital wristwatches include various components that operate in unison to keep time that are contained in a housing and a band that is fastened to the housing and releasably connectable to a user's wrist by a gripping means. Generally, a gripping means includes a clasp and a buckle. However, not only is it challenging in many situations to fasten and unfasten the clasp and buckle of a watch, but they can become worn out and break or cause irritation to the skin of the user and as a result, the user can develop an allergic reaction.

SUMMARY OF THE INVENTION

In view of the drawbacks to known time pieces, in an embodiment, the present invention is directed to sleek, aesthetically pleasing, elegant a slim, flexible, and light weight wrist watch with improved efficiency and life span that incorporates a segmented e-paper display screen and can be easily fastened and unfastened to the wrist of a user and a base station for adjusting the time and controlling watch functionalities on the wrist watch.

In an embodiment, the wrist watch of the present invention is comprised of a plurality of flexible layers of components that are extremely thin and flexible such that the wrist watch appears as a single, unitary band with almost no perceivable thickness and no joints or seams between parts. In an embodiment, the entire wrist watch can be flexed to allow a user to wear the watch on their wrist without the need for a buckle or clasp to secure the band of the watch to the user's wrist.

In an embodiment, the wrist watch can display time. The control for time and time format settings are provided on a base station that is separate and removable from the wrist watch. The base station is used only when the time is to be set on the wrist watch or the wrist watch is to be charged. In another embodiment, the watch can display time and project a sound (e.g., ring, alert, etc.).

According to an embodiment, the watch comprises a spring made of a metal alloy substrate, a port, a rechargeable battery, a flexible circuit board, a display controller, a flexible e-paper display and an adhesive encapsulant. The spring ribbon metal alloy substrate allows the watch to maintain a curved shape and yet is flexible enough to allow the watch to be put on and removed from the user's wrist easily while other components of the wrist watch conform to the curved shape.

An opening on the front surface of the watch allows for a port to be used to synchronize with the base station. In an embodiment, the port can be gold plated connectors through which a data exchange and a charging process are performed with the base station. All the data communication with the wrist watch is performed with the flexible circuit board through the port.

The circuit board is flexible and impregnated with the circuit paths between the internal components such as rechargeable battery and display controller, to provide an interface with the base station. In an embodiment, one end of the flexible circuit board is connected to a rechargeable battery and the other end is connected to a display controller. In an embodiment, the rechargeable battery of the wrist watch is flexible and provides required power for running the wrist watch. In an embodiment, the rechargeable battery can be a solid state battery, a polymer lithium ion battery or any other compatible flexible battery.

The display controller is either provided as a separate circuit or is adopted on the flexible circuit board itself. The display controller is a small flexible microcontroller which manages a time display process and data communication with the base station. The display controller is capable of driving/controlling at least sixty-four segments for displaying the time. The flexible e-paper/e-ink display uses the electrophoresis principle to efficiently display a time. The flexible e-paper display utilizes a custom fixed segment font for using sixty-three of the available sixty-four segments exactly. The flexible e-paper display provides a time to a user either in a twelve hours format, in a twenty four hours format, or both.

In an embodiment, the base station is configured to adjust the wrist watch functions. All the controls of the wrist watch are provided on the base station. In an embodiment, the top of the base station comprises three buttons that are used to set time and to change the time format. The base station also comprises a set of spring connectors that connect the base station with the port of the wrist watch to assist in a data exchange process and in a charging process with the wrist watch. The base station further comprises a slot and an interior hinged assembly that swings the spring connector into place when the end of the watch is inserted into the slot. The base station also comprises a mini Universal Serial Bus (USB) port for connecting the base station to a suitable power source for charging the rechargeable battery.

In an embodiment, an end of the wrist watch is first inserted (docked) into the slot of the base station when a time is to be set in the wrist watch. The docking process overlaps and synchronizes the port of the wrist watch with the spring connectors of the base station. Once the synchronization is established, the wrist watch is controlled appropriately by the three buttons on the base station.

In an embodiment, the watch is set by placing the watch in the base station. The buttons on the top of the base station are used to adjust the time on the watch, including an hour, a minute, and a time format (12/24 hour).

In an embodiment, a method of manufacturing the wrist watch of reduced thickness and high flexibility comprises the steps of attaching all the electronic components that include a flexible circuit board, a microcontroller, a rechargeable battery and a flexible e-paper display together. The rechargeable battery is connected to the flexible circuit board. The electronic components are encapsulated in a flexible adhesive, with an ink mask screen printed on top of this adhesive. The color of the mask may be the same as the color of the segments under an off-state condition inside the e-paper display. The mask is precisely aligned with the wrist watch which is printed on top of a cured adhesive encapsulant above the flexible e-paper display screen. The sub-assembly of the electronic components and the mask are then flexibly bonded to the spring type metal alloy substrate and the final wrist watch assembly is produced. The spring type metal alloy substrate is formed in a rectangular shape with rounded corners and a pocket with ridges for added protection and structural support.

These and other aspects of the embodiments herein will be better appreciated and understood when considered in conjunction with the following description and the accompanying drawings.

BRIEF DESCRIPTION OF THE DRAWINGS

The present invention will be further understood and appreciated by reading the following description in conjunction with the accompanying drawings in which.

DETAILED DESCRIPTION OF EMBODIMENTS OF THE INVENTION

For the following detailed description, reference is made to the accompanying drawings that form a part hereof, and in which embodiments of the present invention that may be practiced are shown by way of illustration. These embodiments are described in sufficient detail to enable those skilled in the art to practice the embodiments and it is to be understood that changes may be made without departing from the scope of the embodiments. The following detailed description is therefore not to be taken in a limiting sense.

Figure 1:
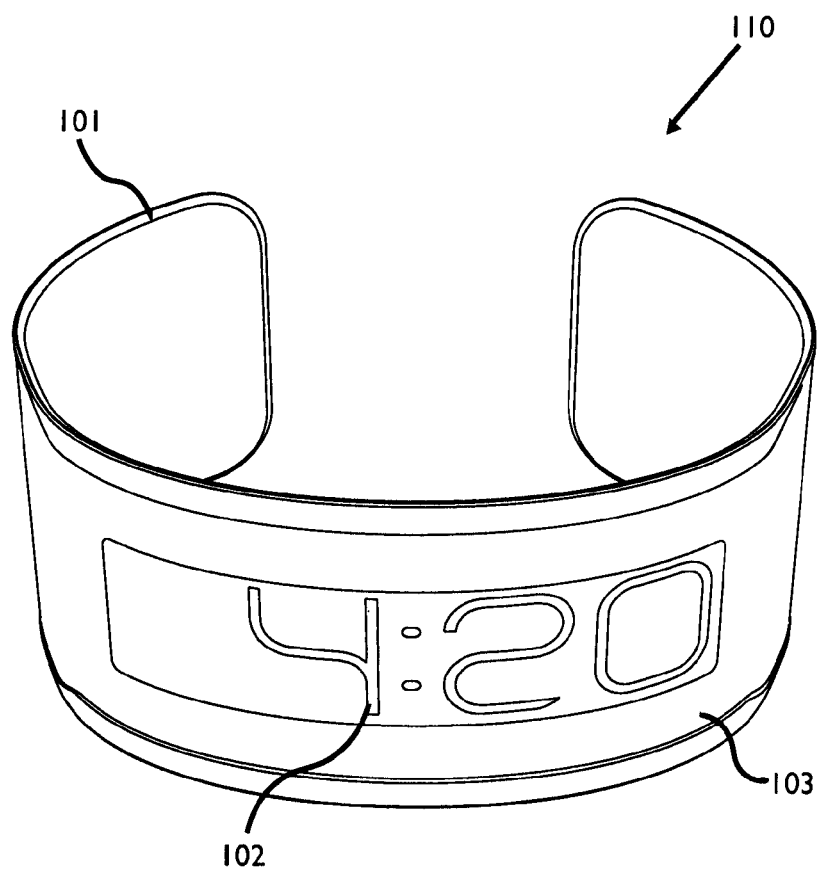
FIG. 1 is a front perspective view of an embodiment of a flexible and thin wrist watch of the present invention.

With reference now to the drawings, FIG. 1 illustrates a front perspective view of an embodiment of a wrist watch of the present invention that is designated hereinafter by reference numeral 110. The wrist watch 110 is flexible and very thin resembling a circumferential ribbon/band that has almost no perceivable thickness. In an embodiment, the thickness of the wrist watch 110 is less than 1 mm. In an embodiment, the thickness of the wrist watch 110 is about 0.5 mm. The wrist watch 110 is comprised of a spring-type metal alloy substrate 101, a flexible circuit board 301, a rechargeable battery 305, a microcontroller 302, a flexible e-paper display 303 that includes a custom fixed-segment font 102, an adhesive encapsulant 103, a port 202 and a screen-printed mask 304.

In an embodiment, the spring ribbon metal alloy substrate 101 forms an inner band that is curved to contour to the wrist of the user and can include a channel in which the flexible circuit board 301, rechargeable battery 305, microcontroller 302, flexible e-paper display 303 and adhesive encapsulant 103, port 202 and screen-printed mask 304 are arranged and sealed. The spring-type metal alloy 101 is adaptable such that the wrist watch 110 is flexible throughout the entire length of the band while at the same time maintains a curved (i.e., circular or rounded) shape as shown FIG. 1 during both use and non-use, which allows a user to wear the wrist watch 110 without the need for a clasp or buckle to remain on a user's wrist. The spring-type metal alloy 101 thus maintains the shape of the watch 110 while the other components of the watch 110 flex to conform to the curved shape.

In use, the watch 110 is flexible outwardly to allow a user's wrist to be placed therein. As the user releases the wrist watch 110, the wrist watch 110 constricts to the original curved shape, adhering to the wrist of the user.

As shown, the front side of the wrist watch 110 is enclosed in the liquid adhesive encapsulant 103. The front surface of the adhesive encapsulant 103 comprises a layer of screen printed mask 304 (see FIG. 3). In an embodiment, the custom fixed-segment font 102 displays the time in twelve hour format as well as in twenty four hour format with the time displayed by four numbers with a colon between the second and third number.

Figure 2:
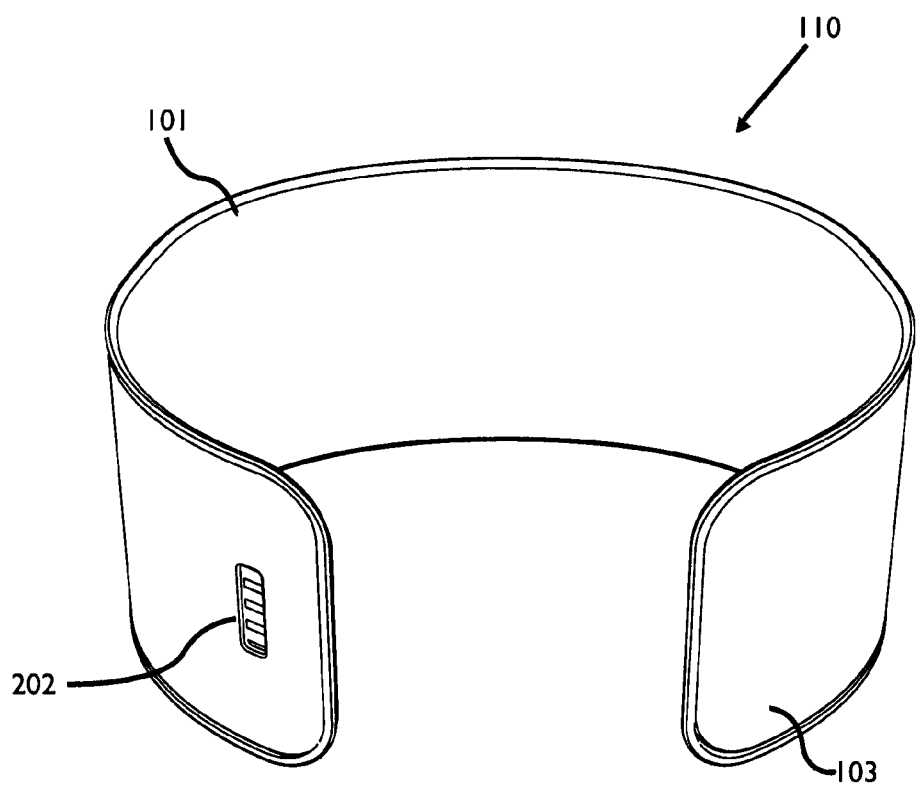
FIG. 2 is a rear perspective view of the flexible and thin wrist watch of FIG. 1.

FIG. 2 illustrates a rear perspective view of the wrist watch 110. As shown, the watch 110 includes an opening in the screen printed mask 304 through which the port 202 extends. In an embodiment, the port 202 is comprised of gold plated connectors that are adaptable to communicate with the flexible, thin microcontroller 302, which is encapsulated between the mask 304 of the adhesive encapsulation 103 and the spring ribbon metal alloy substrate 101. The port 202 assists in a data transfer between the watch 110 and a base station (as will be described in more detail below) and is configured to allow for charging of the thin, flexible rechargeable battery 305. However, the port 202 can be comprised of any material and/or take the form of any means that would permit the exchange of data and a charging process to be performed between the flexible circuit board 301 through the port 201 and a base station.

Figure 3:
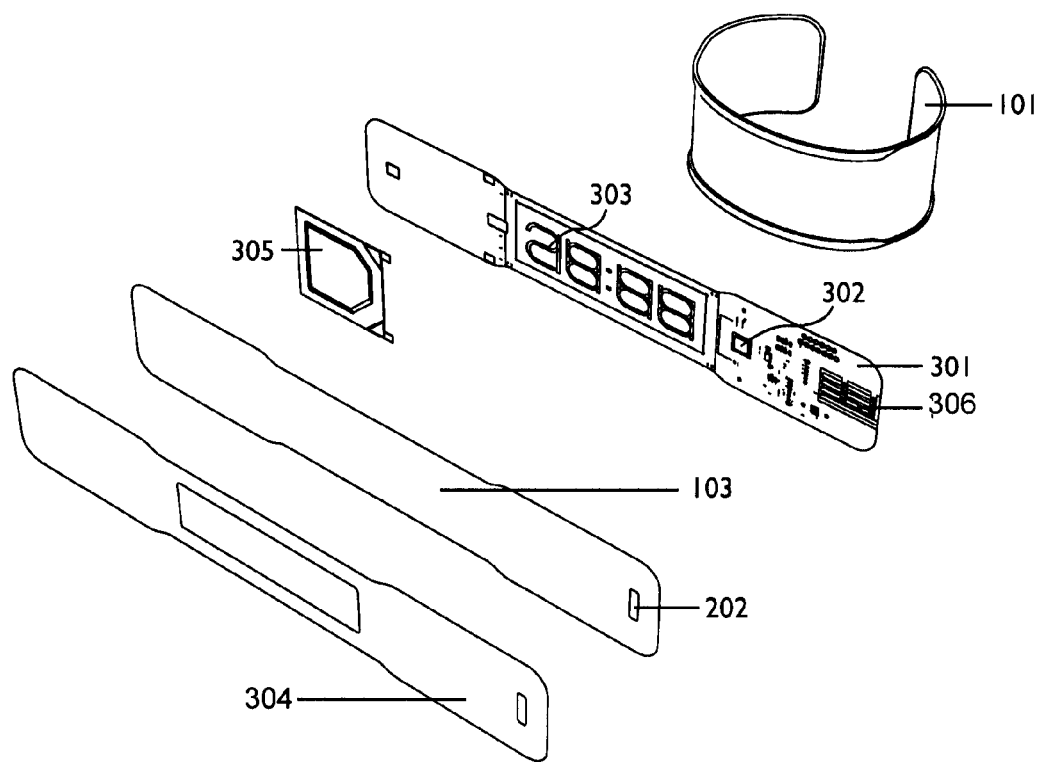
FIG. 3 is an exploded perspective view of the flexible and thin wrist watch of FIG. 1.

FIG. 3 illustrates an exploded perspective view of the wrist watch 110. The spring type metal alloy substrate 101 is shown in a curved shape. In an embodiment, one end of the spring type metal alloy substrate 101 can overlap the other end thereof to ensure the watch band fully encompasses a user's wrist. As can be seen in FIG. 3, the adhesive encapsulant 103 comprises a port 202 that through an opening is connected with the flexible circuit board 301. The flexible circuit board 301 is impregnated with a plurality of circuit paths between the internal components of the watch 110, including the battery 305 and microcontroller 302 to provide an interface with the base station. In an embodiment, the circuit board 301 comprises a plurality of connections 306 which are connected to the microcontroller 302 at one end of the circuit board 301, which may include a display controller that regulates a display of time, to which may be mounted a thin flexible e-paper/e-ink display screen 303. In an embodiment, the circuit board 301 can include four connections 306. The display controller 302 is either provided as a separate circuit or is integrated on the flexible circuit board 301 itself. The display controller 302 is configured to be able to control at least sixty-four segments for displaying time. The e-paper display screen 303 uses electrophoresis principle to display sixty-three of the available sixty-four characters of time. The flexible e-paper display screen 303 is encapsulated in adhesive 103 with the screen printed mask 304. The flexible circuit board 301 is also connected to the thin flexible battery 305, which drives the microcontroller 302 and the e-paper display screen 303. In an embodiment, the battery 305 can be a solid state battery, and/or a polymer lithium ion battery, or any other flexible battery that may be known or become known. In an embodiment, the battery 305 can be charged in less than twenty minutes and can hold the charge for about one month.

According to an embodiment, a method of manufacturing the wrist watch 110 comprises the steps of attaching all electronic components together, including the flexible circuit board 301, the microcontroller 302, the rechargeable battery 305 and the flexible e-paper display 303. The rechargeable battery 305 is connected to the flexible circuit board 301. The color of the mask may be the same as the color of the segments under an off-state condition inside the e-paper display 303. The mask 304 is precisely aligned with the wrist watch 110, which is printed on top of a cured adhesive encapsulant 103 above the flexible e-paper display screen 303. The sub-assembly of the electronic components and the mask 304 are then flexibly bonded to the spring type metal alloy substrate 101 and the final wrist watch 110. The spring type metal alloy substrate 101 is formed in a rectangular shape with rounded corners and a pocket with ridges for added protection and structural support.

Figure 4:
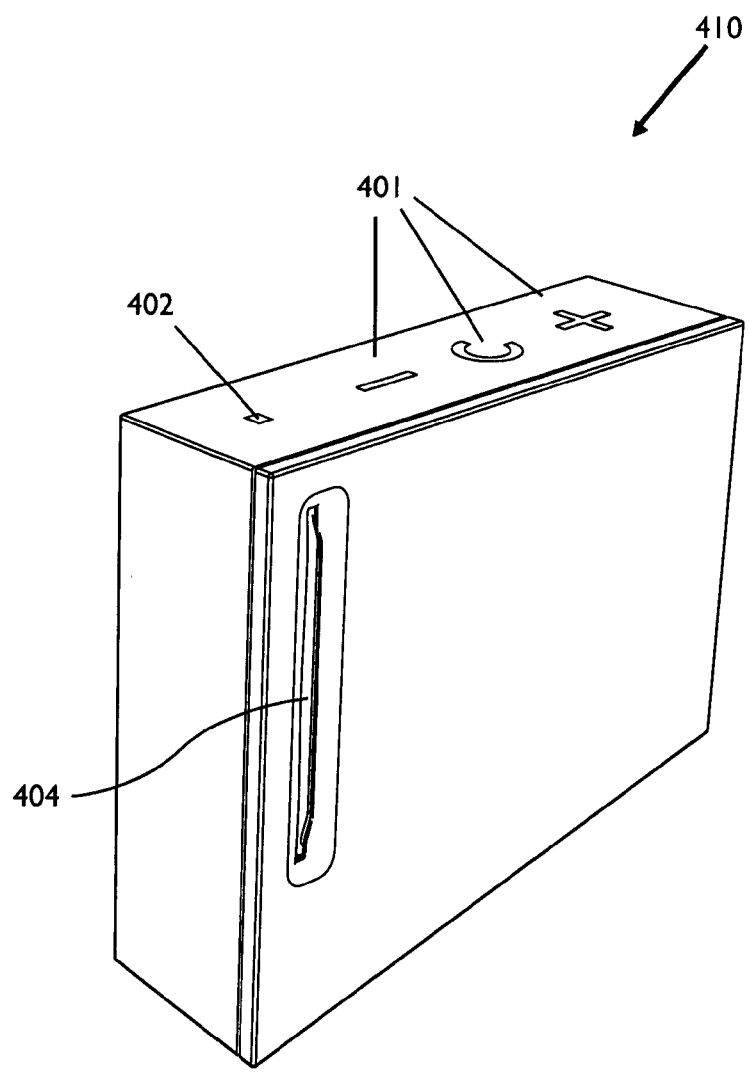
FIG. 4 is a first perspective view of an embodiment of a base station.

FIG. 4 illustrates a front perspective view of an embodiment of a base station 410. The base station 410 is the separate module that is associated with the wrist watch 110 for controlling the functionalities thereof when the wrist watch 110 is connected and synchronized with the base station 410. In an embodiment, the base station 410 is prismoid in shape and comprises a plurality of buttons 401 for setting time and changing the time format of the wrist watch 110. In an embodiment and as shown in FIG. 4, the base station includes three buttons 401. An outer surface of the base station 410 comprises a slot 404 inside which (see FIGS. 7b, 7c) is a rotatable assembly 701 and a plurality of spring connectors 702 that are configured to attach to the port 202 of the wrist watch 110 to assist in a data exchange and a charging of the rechargeable battery 305 of the wrist watch 110. In an embodiment, there can be four connectors 702. The rotatable assembly 701 swings into place to allow the spring connectors 402 to connect with the connections of the port 202 of the watch 110 to assist in a data exchange between the base station 410 and watch 110 and charging of the watch 110.

Figure 5:
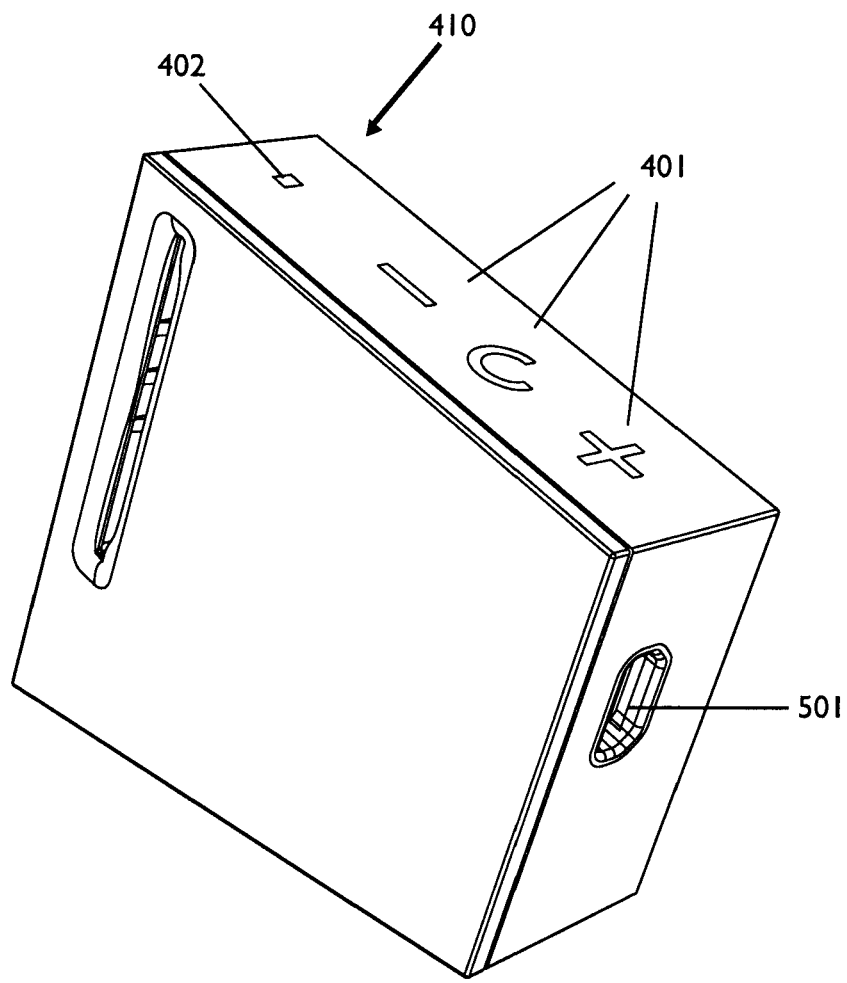
FIG. 5 is a second perspective view of the base station.

FIG. 5 illustrates a rear perspective view of an embodiment of the base station 410. The buttons 401 are provided to control the functionalities of the flexible and slim wrist watch. In an embodiment, the rear surface of the base station 410 comprises a Universal Serial Bus (USB) port 501 that is connectable to a power source with a suitable adapter to directly charge the rechargeable battery 305 of a wrist watch 110 associated with the base station 410 when the wrist watch 110 is attached to the base station 410. In an embodiment, the USB port 510 can be a mini or micro USB port. In an embodiment, the power source attached to the USB port 510 can charge a battery of the base station 410 and then in turn charge the rechargeable battery 305 of the watch 110. In an embodiment, the base station 410 can include an aperture 402 that emits a preset color light for an elegant look and to communicate the status of charging.

Figure 6:
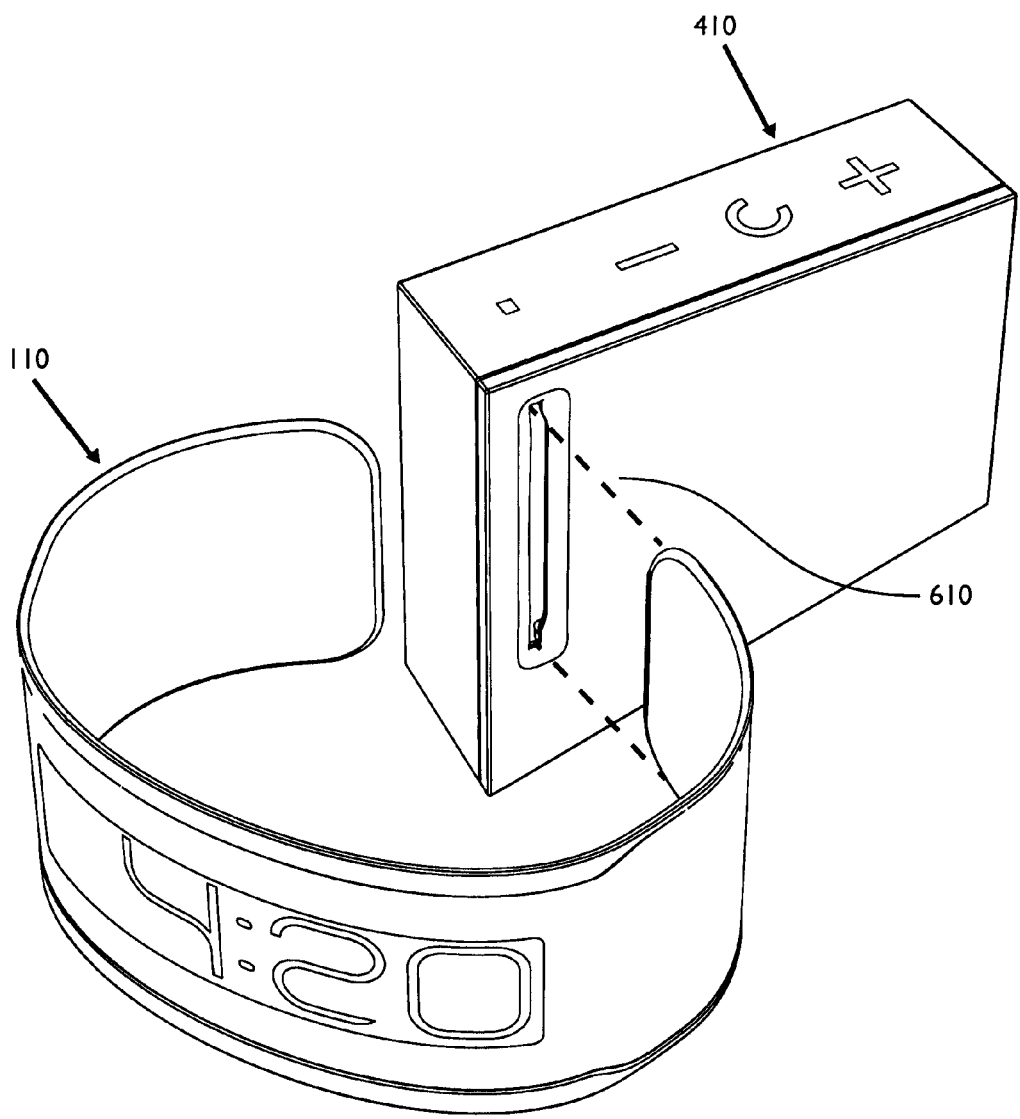
FIG. 6 is a perspective view of the flexible and slim wrist watch of FIG. 1 being docked to the base station of FIG. 4.

FIG. 6 illustrates a front perspective view of an embodiment of the watch 110 in the process of docking with the base station 410. As indicated above, the wrist watch 110 when removed from a wrist of the user has a curved shape. To dock the wrist watch 110 onto the base station 410, an end of the wrist watch 110 from which the port 202 is arranged is first inserted into the slot 404 of the base station 410 when a time is to be set in the watch by pushing the watch 110 along the dotted lines 610 into the slot 404. The docking process overlaps and synchronizes the port 202 of the watch 110 with the spring connectors 702 of the base station 410. Once the synchronization is established, the wrist watch 110 can be controlled by the buttons 401 on the base station 410 to set and change the time format. More specifically, the buttons 401 can modify the hour, minute and time format (e.g., 12/24 hour) of the watch 110 of the base station 410. When the user desires to wear the wrist watch 110, the wrist watch 110 is removed by slowly from the base station 410 by sliding the wrist watch 110 out of the slot 404, detaching the port 202 from the connectors 702.

Figure 7A:
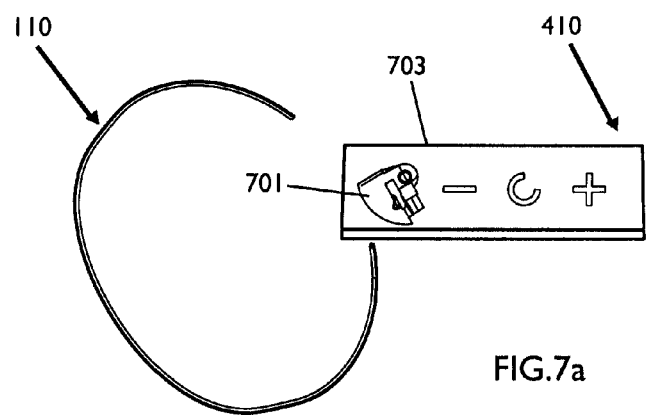
FIGS. 7a through 7c are top views of an embodiment of the flexible and slim wrist watch of FIG. 1 being docked to the base station of FIG. 4.
Figure 7B:
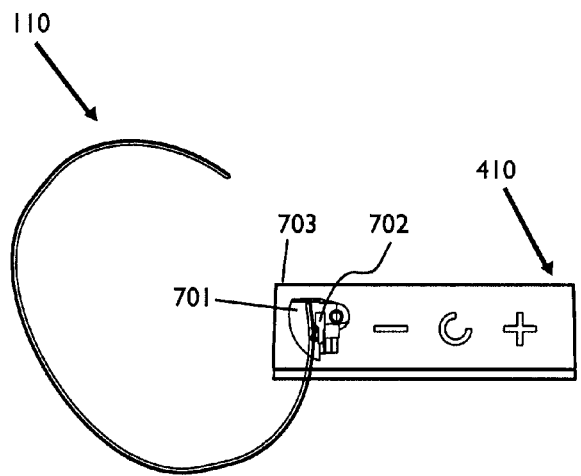
Figure 7C:
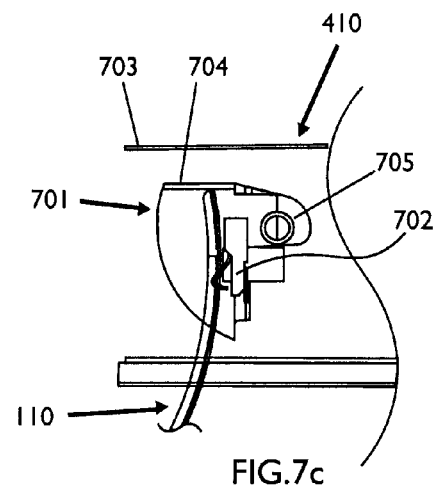
Figure 8:
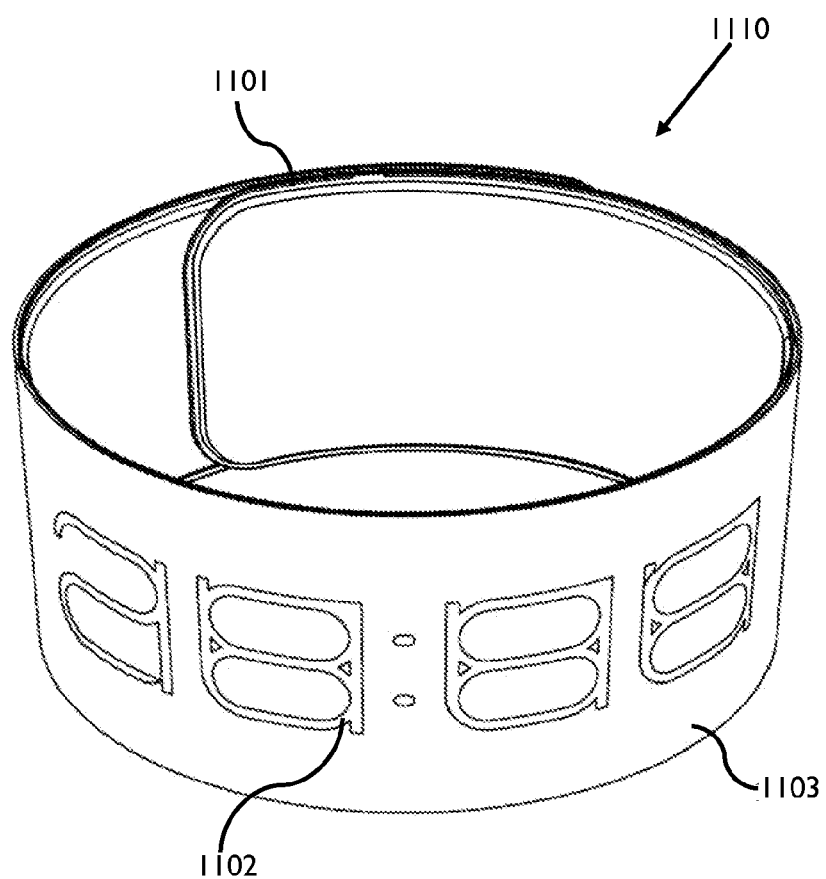
FIG. 8 is a front perspective view of another embodiment of a flexible and thin wrist watch of the present invention.
Figure 9:
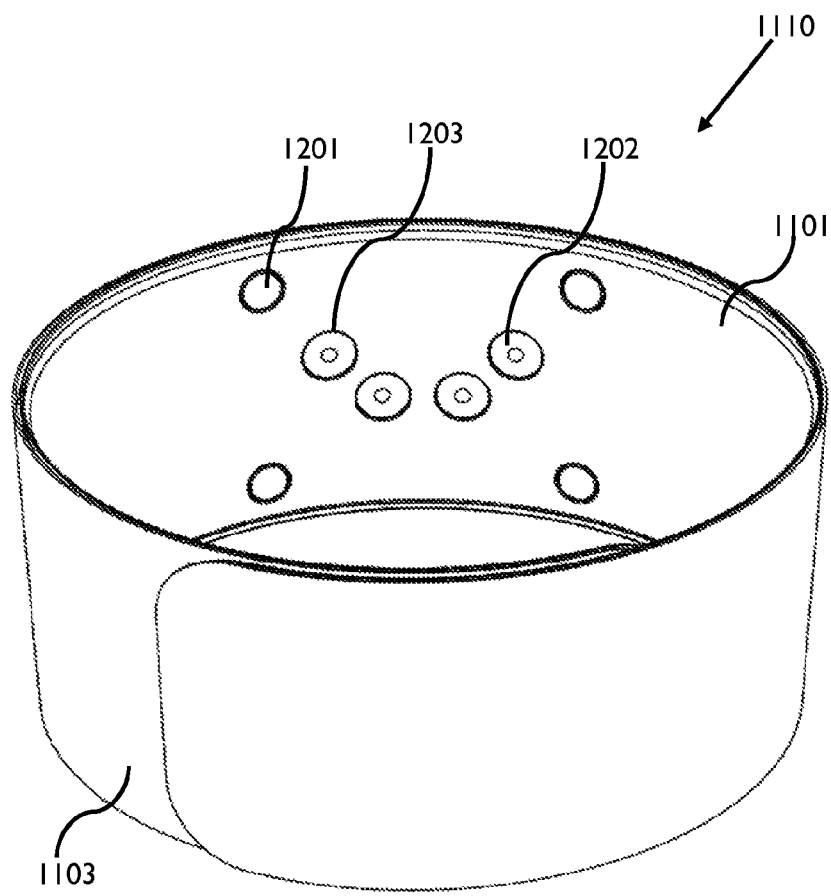
FIG. 9 is a rear perspective view of the flexible and thin watch of FIG. 8.
Figure 10:
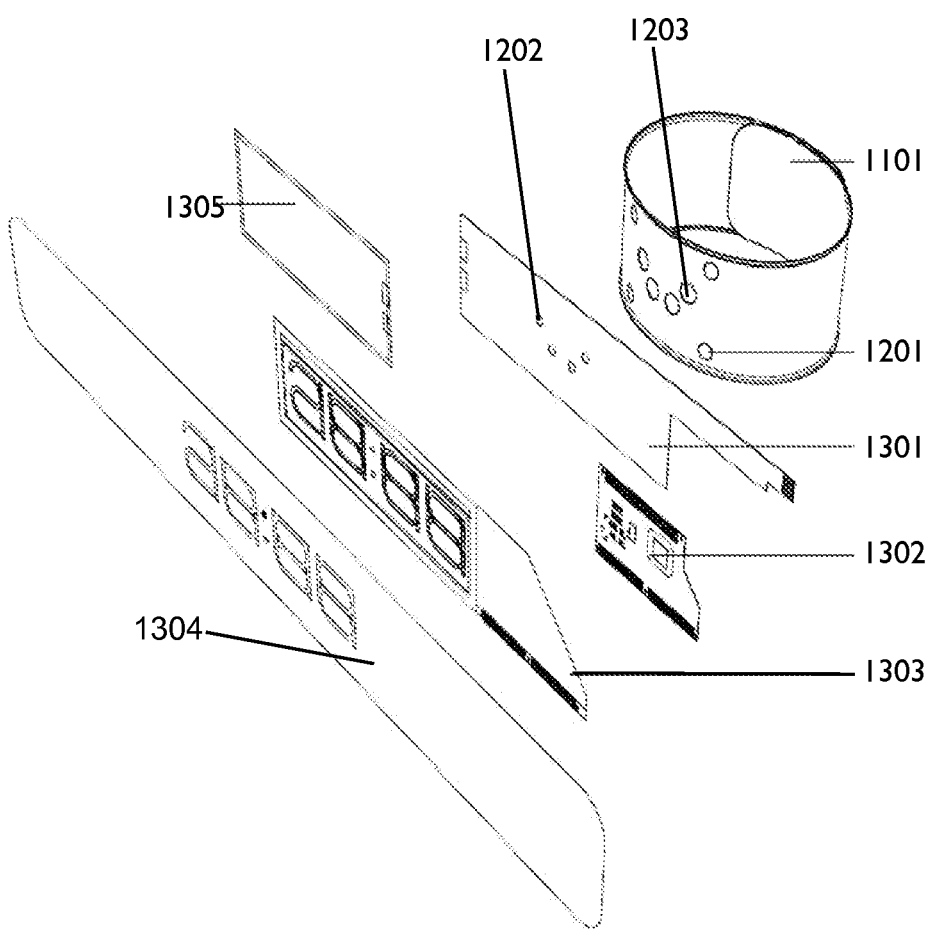
FIG. 10 is an exploded perspective view of the flexible and thin wrist watch of FIG. 9.

FIGS. 7a-7c illustrate top views of the watch 110 in the process of being docked to the base station 410, with the top surface of the base station 410 cut away to reveal the rotatable assembly 701. FIG. 7a illustrates the watch 110 and the base station 410 immediately prior to inserting the watch 110 into the base station 410. FIG. 7b illustrates the watch 110 being docked into the base station 410. FIG. 7c is a partial cross-sectional view of the rotatable assembly 701 of the base station 410.

To connect the watch 110 with the base station 410, the watch 110 is first inserted into the slot 404 of the base station 410. When the watch is being inserted into the slot 404, the end of the watch 110 contacts a back of a swinging assembly 704 which in turn causes the rotatable assembly 701 to pivot into place to allow the spring connectors 702 to connect with the port 202, making an electrical connection with the watch 202. The connectors 702 are used to connect the internal circuitry of the base station 410 to the watch 110 and assist in a data exchange and a charging of the rechargeable battery 305 of the watch 110. When the watch 110 is removed from the base station 410, a spring 705 moves the rotatable assembly 701 to its original position, moving the spring connectors 702 out of the port 202 and allowing the watch 110 to be safely removed from the base station 410.

FIGS. 8-14 illustrate another embodiment of a watch 1110 and an associated base station 1410. For FIGS. 8-14, the features of the watch and base station that are substantially the same structurally and/or functionally to the embodiment depicted in FIGS. 1-8 are presumed to descriptive of FIGS. 8-14 as well. As shown in FIG. 2, the watch 1110 comprises a plurality of ports 1202 to assist in data transfer between the watch and the base station 1410. Other ports 1202 that are ferromatic are provided on the spring ribbon substrate 1010 and used to align the watch 1110 with the base station 1410. The plurality of holes 1203 provides openings to connect the ports 1202 with the circuit board 1301. In an embodiment, there are four holes 1203.

Figure 11:
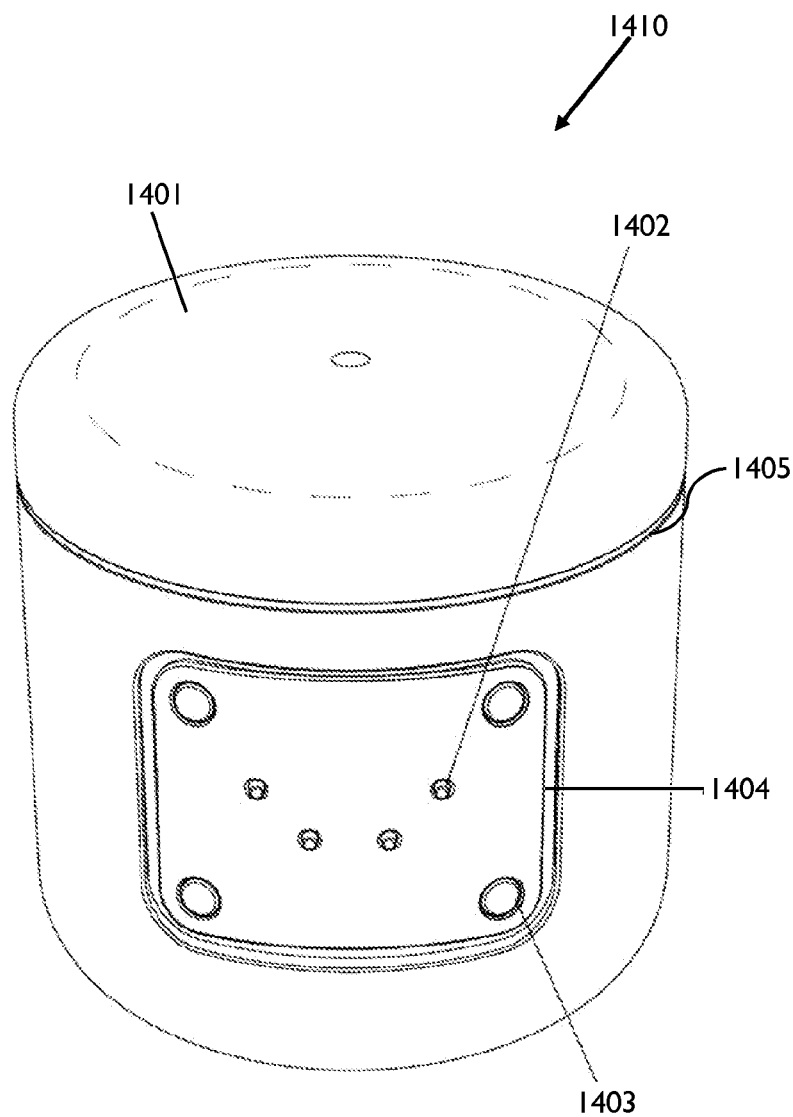
FIG. 11 is a first perspective view of another embodiment of a base station.
Figure 12:
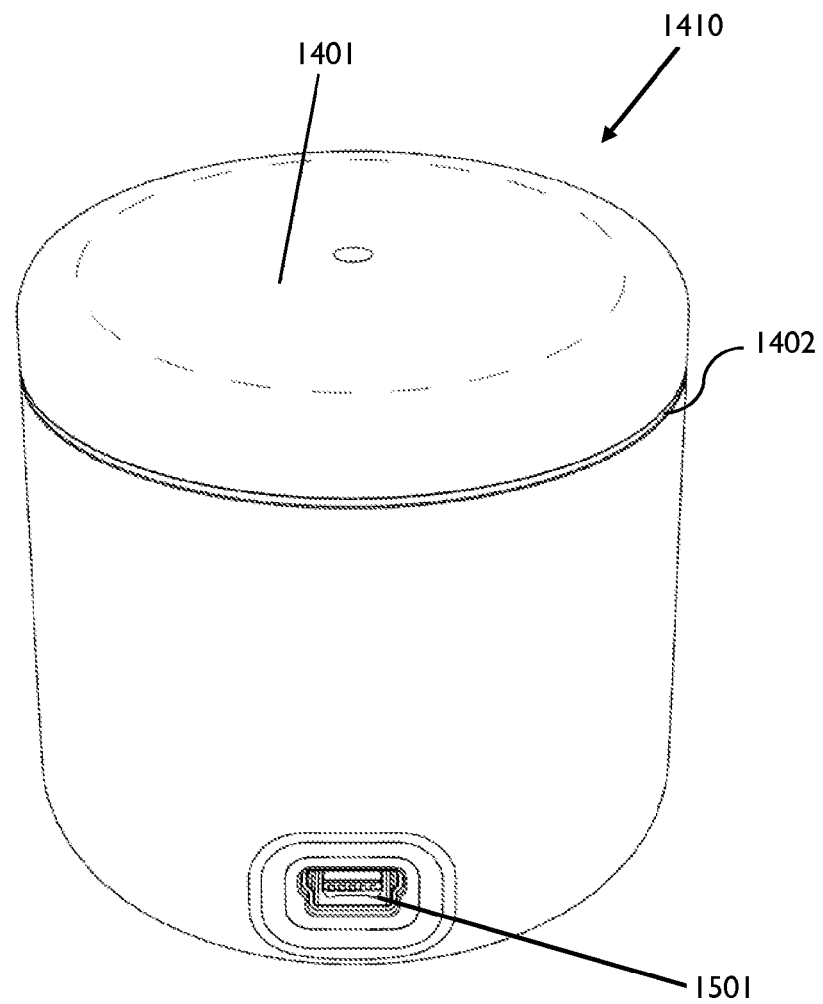
FIG. 12 is a second perspective view of the base station.

As shown in FIGS. 11 and 12, the base station 1410 is the separate individual module for controlling the functionalities of the flexible and slim wrist watch 1110. The base station 1410 is cylindrical in shape and comprises a rotating dial 1401 at the top. The rotating dial 1401 allows a setting of time and time format, when the flexible and slim wrist watch is attached to the base station 1410. The rotating dial 1401 further comprises a push option for setting a time display. A push action on the top of the rotating dial 401 changes the time display between twelve (12) hour display format and twenty four (24) hour display format. The cylindrical surface of the base station 1410 comprises a block 1404 comprising a set of four magnetic cylinders 1403 and a set of four spring connectors 1402. The set of four magnetic cylinders 1403 aligns and holds the flexible and thin wrist watch firmly in a fixed position around the base station 1410. The four circular inserts 1403 are attached to the four circular inserts 1202 of the flexible and thin wrist watch. The set of four connectors 1402 are used to connect the internal circuitry of the base station 1410 to the flexible and slim wrist watch. The set of four spring connectors 1402 is slightly protruded out of the surface of the base station 1410 to provide a better contact with the flexible and slim wrist watch. The set of four connectors 1402 assist in a data exchange and a charging of the rechargeable battery of the flexible and slim wrist watch. A cleavage 1405 is provided on the surface of the base station 1410 to emit a predefined light for providing a good appearance.

Figure 13:
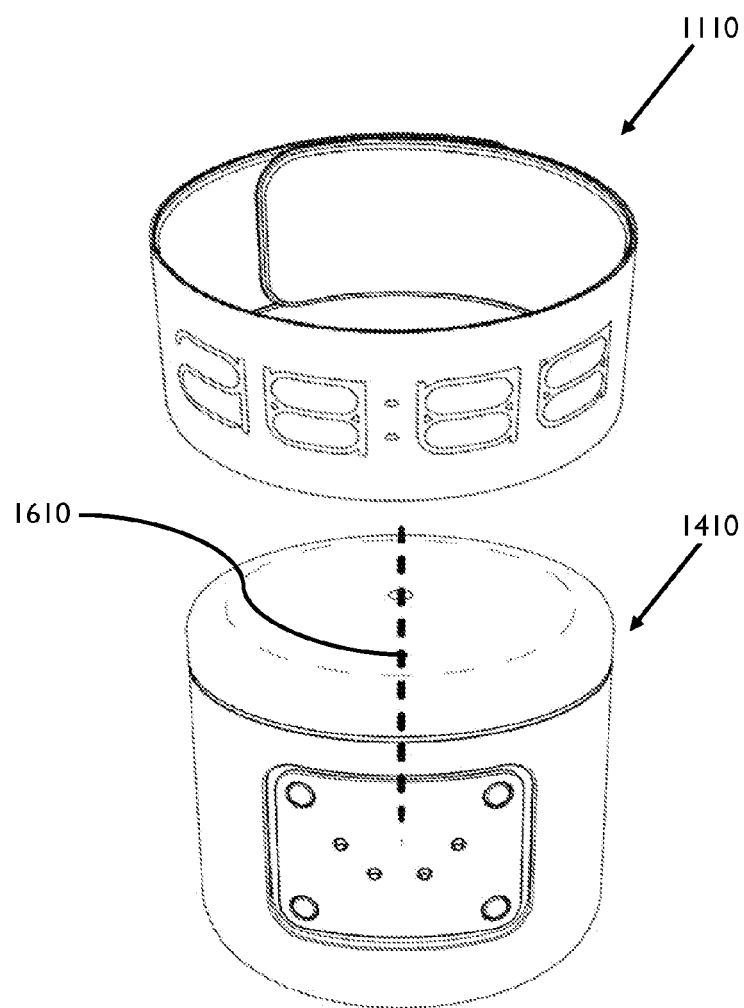
FIG. 13. is a first perspective view of the wrist watch of FIG. 8 being docked to the base station of FIG. 11.
Figure 14:
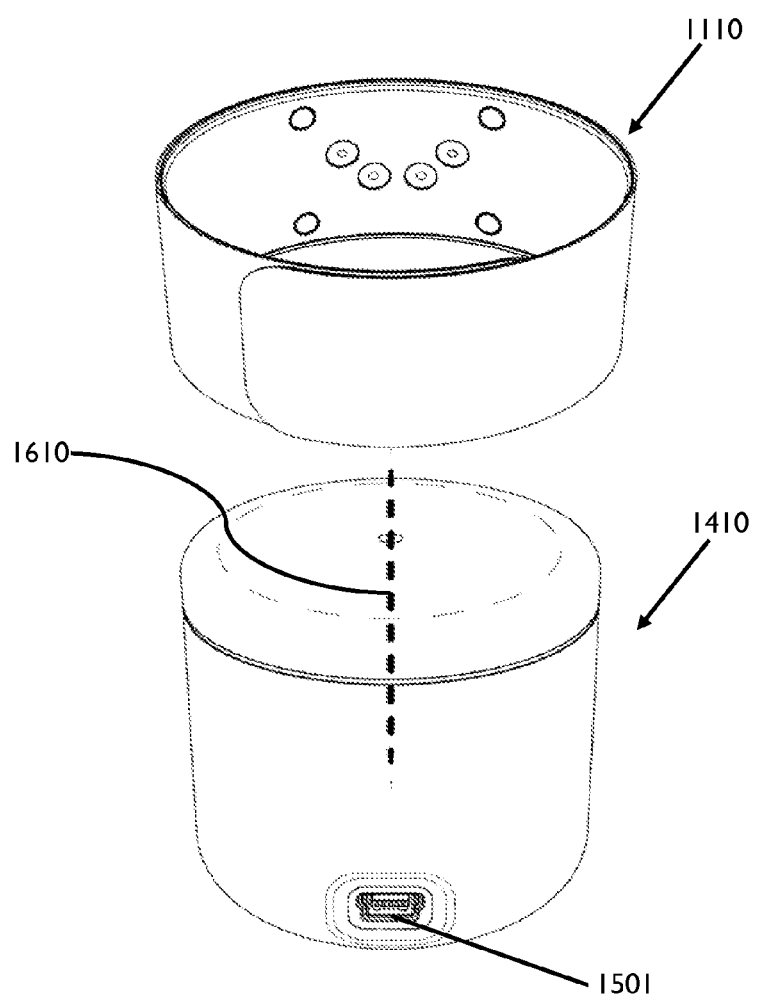
FIG. 14 is a second perspective view of the wrist watch of FIG. 8 being docked to the base station of FIG. 11.

FIGS. 13 and 14 illustrate an embodiment of a perspective view of the watch 1110 in the process of docking to the base station 1410. The wrist watch 1110 when removed from a wrist of the user is curved into a circular shape where one end of the wrist watch 1110 overlaps with other end of the wrist watch 1110. The wrist watch 110 is then slotted into the base station from the side of the base station 1410 by pushing the side of the wrist watch 1110 along the dotted lines 1610. When the wrist watch 1110 is docked on the base station 1410, the set of four spring connectors on the base station 1410 are connected to the ports of the wrist watch 1110 to make a contact. The four ferromagnetic circular inserts in the band 1101 of the wrist watch 1110 are automatically aligned with the magnetic cylinders in the charging station. When the user desires to wear the wrist watch 1110, the wrist watch 1110 is removed by slowly pulling up the wrist watch from of the top of the base station 410.

One of the advantages of the present invention is the usage of a custom fixed-segment font that utilizes only 63 of the available 64 segments thereby allowing the watch to be driven by a single integrated circuit. The watch is extremely energy efficient due to the less number of components, an efficient display technology and an efficient circuitry. The flexible and slim design of the wrist watch requires no enclosure thereby simplifying the design and system of the product and reduces a manufacturing cost. The wrist watch uses flexible display and is also flexible throughout the entire length.

Although this invention has been disclosed in the context of certain embodiments and examples, it will be understood by those skilled in the art that the invention extends beyond the specifically disclosed embodiments to other alternative embodiments and/or uses of the invention and obvious modifications and equivalents thereof. In addition, while several variations of the embodiments of the invention have been shown and described in detail, other modifications, which are within the scope of this invention, will be readily apparent to those of skill in the art based upon this disclosure. It is to be understood that the phraseology or terminology employed herein is for the purpose of description and not of limitation.

What is claimed is:

1. An ultrathin curved wearable device for displaying time, adaptable to fit in a base station, comprising:
   a spring ribbon comprised of a metal alloy substrate;
   a flexible circuit board arranged on said ribbon;
   a display controller electronically attached to said circuit board;
   a flexible and segmented e-paper display in communication with said controller;
   a rechargeable battery for powering said circuit board;
   an adhesive encapsulant for encapsulating at least said circuit board, said controller, and said battery;
   a mask aligned with said ribbon; and
   contacts to electronically link said flexible circuit board to said base station for charging and control,
   wherein said device is flexible, with no visible part lines on the edges or back surface.

2. The device of claim 1, wherein said metal alloy substrate is formed of an alloy which retains shape.

3. The device of claim 1, wherein said rechargeable battery is at least one of solid state and partially comprised of a polymer lithium ion.

4. The device of claim 1, wherein said display uses an electrophoresis principle to efficiently display time.

5. The device of claim 1, wherein said display controller is a flexible microcontroller.

6. The device of claim 1, wherein the length of said ribbon is adjustable.

7. A method for producing an ultrathin wearable timekeeping device, comprising the steps of:
   preparing a flexible circuit board for arrangement on a spring ribbon comprised of a metal alloy substrate;
   electronically attaching a display microcontroller to said circuit board;
   electronically attaching a flexible, segmented e-paper display for communicating with said controller;
   electronically attaching a rechargeable battery to said circuit board; and
   encapsulating at least said circuit board, microcontroller, and battery in an ink mask screen printed flexible adhesive, and aligning said mask with said ribbon, thereby forming a sub-assembly; and
   flexibly bonding said sub-assembly to said metal alloy substrate;
   wherein said device is flexible and ultrathin, without visible part lines on the edges or back surface.

8. The method of claim 7, wherein said metal alloy substrate is formed of an alloy which retains shape.

9. The method of claim 7, wherein said rechargeable battery is at least one of solid state and partially comprised of a polymer lithium ion.

10. The method of claim 7, wherein said display uses an electrophoresis principle to efficiently display time.

11. The method of claim 7, wherein said display controller is a flexible microcontroller.

12. The method of claim 7, wherein the length of said substrate is adjustable.

* * * * *